United States Patent [19]

James et al.

[11] Patent Number: 5,052,935

[45] Date of Patent: Oct. 1, 1991

[54] PREWIRED CIRCUIT MODULE

[75] Inventors: Robert L. James, Cambridge; Ronald E. Miller, Zanesville, both of Ohio

[73] Assignee: Delta Systems, Incorporated, Cambridge, Ohio

[21] Appl. No.: 566,110

[22] Filed: Aug. 13, 1990

[51] Int. Cl.⁵ .............................................. H01R 29/00
[52] U.S. Cl. .......................................... 439/49; 439/76; 439/189
[58] Field of Search .............................. 439/35, 43–52, 439/76, 535, 189, 437–441, 507

[56] References Cited

U.S. PATENT DOCUMENTS

| | | | |
|---|---|---|---|
| 3,345,599 | 10/1967 | Henschen | 439/49 |
| 4,165,443 | 8/1979 | Figart et al. | 439/438 |
| 4,210,772 | 7/1980 | Magana et al. | 439/389 |
| 4,336,418 | 6/1982 | Hoag | 439/438 |
| 4,718,853 | 1/1988 | Orbanic | 439/35 |
| 4,729,740 | 3/1988 | Crowe et al. | 439/438 |
| 4,924,032 | 5/1990 | Akins | 174/53 |

Primary Examiner—Neil Abrams
Attorney, Agent, or Firm—Cushman, Darby & Cushman

[57] ABSTRACT

A circuit module comprises a housing enclosing a printed circuit board designed to be adaptable to a variety of standard wiring applications. The printed circuit board includes plural conducting paths, some of which may be selectively coupled via a shorting bar to adapt the circuit module to the various wiring applications. The module has various electrical junctions and ports which are provided in the housing and are adapted to be releasably connected to a source of power and to a standard electrical load, such as a lamp or switch. The modules can be interconnected whereby, for example, a module joined to a lamp may be wired to another module connected to a switch.

8 Claims, 10 Drawing Sheets

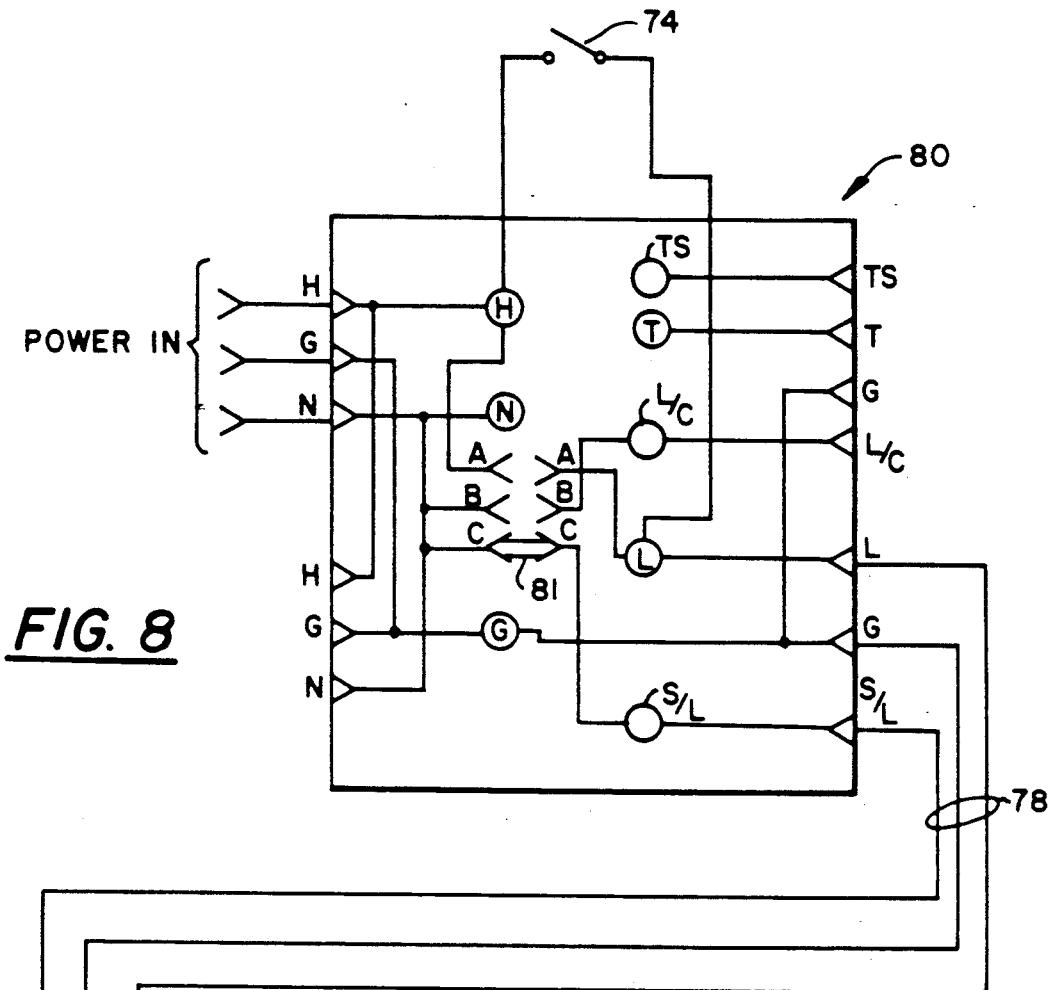
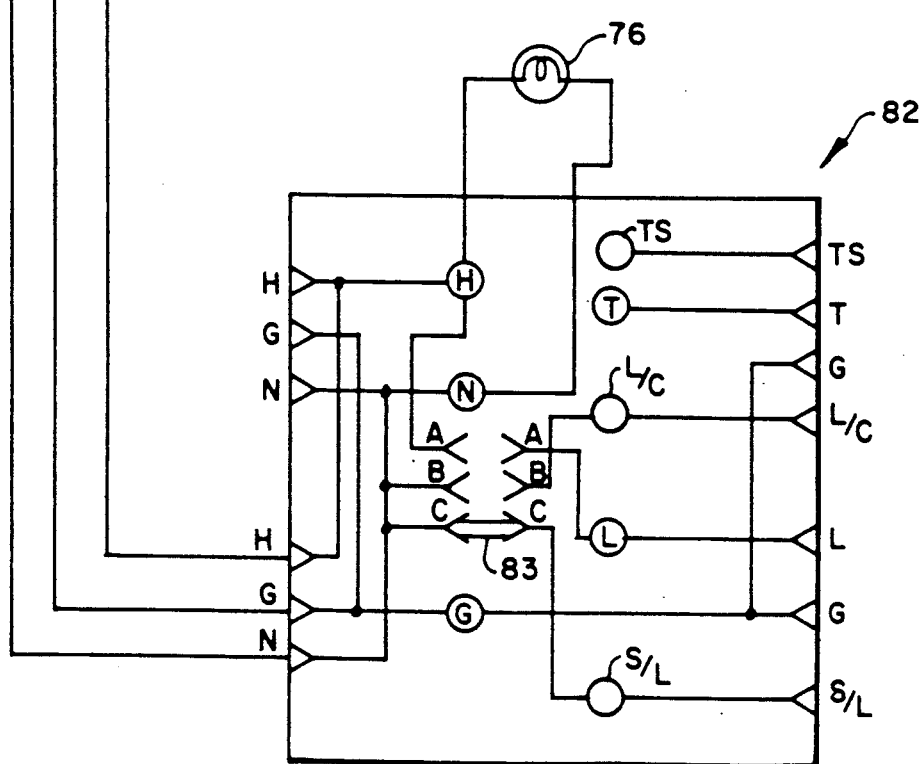
FIG. 8

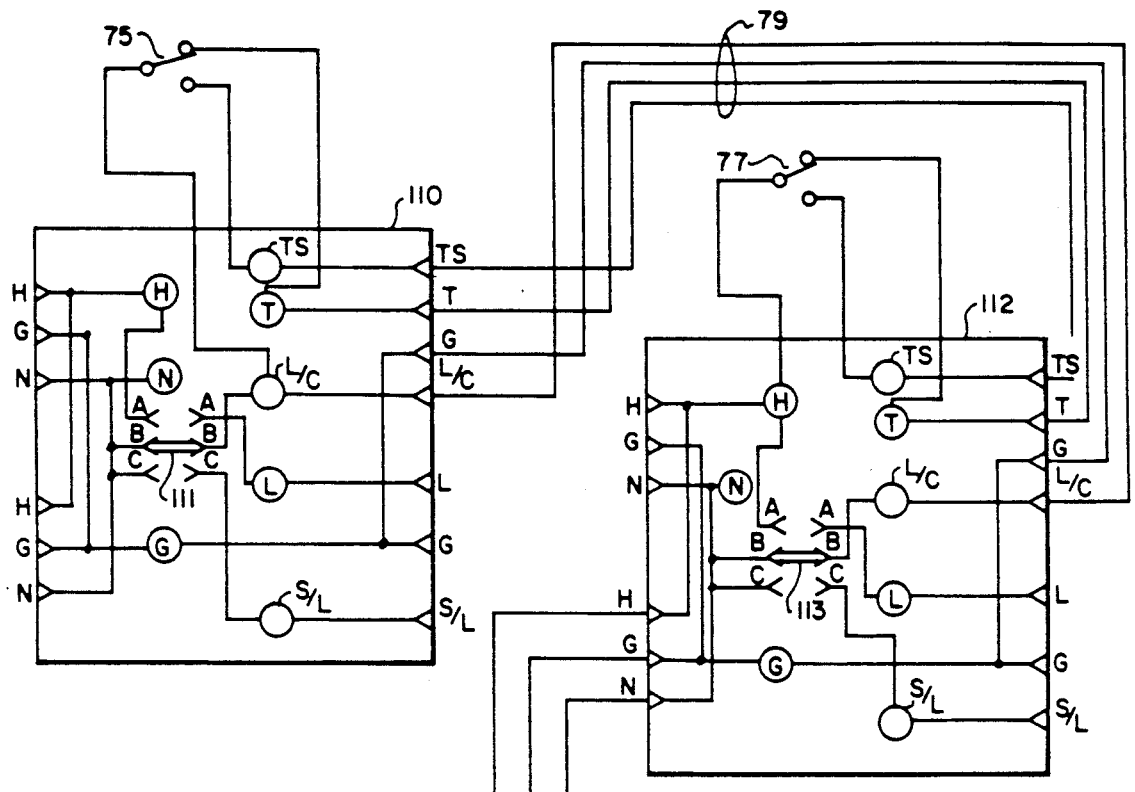
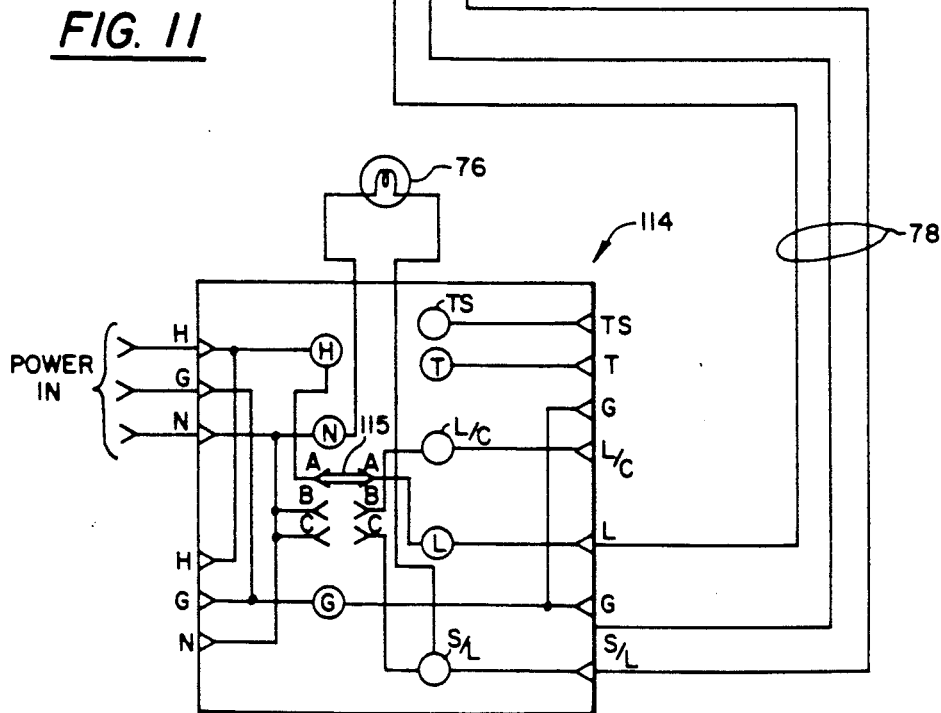
FIG. 11

5,052,935

PREWIRED CIRCUIT MODULE

BACKGROUND OF THE INVENTION

1. Field of the Invention

The present invention relates to prewired circuit modules, and more particularly, to circuit modules which may be employed for standard wiring applications normally encountered in electrical installations.

2. Description of Prior Art

To install electrical fixtures in a residence or commercial dwelling, an electrician must wire each fixture differently. For example, electrical switches are wired differently than light fixtures. As a result, electrical installation is a timely, inefficient and costly process. Moreover, due to the many different wiring schemes required for various fixtures, the likelihood of error in wiring a fixture is substantial.

There have been various "prewired" modules intended to provide easy and quick installation for single pole switches, three-way switches, outlets and light fixtures. Although such modules increase installation efficiency with respect to the fixtures for which the modules are designed, the modules are not adaptable to a variety of fixtures. Moreover, they usually require specially designed plug-in switches and receptacles. Due to these and other limitations, known prewired modules fail to provide devices adaptable to a variety of standard electrical fixtures.

SUMMARY OF THE INVENTION

An object of the present invention is to provide a prewired, versatile circuit module which may be employed for a variety of standard electrical fixtures.

To achieve this objective, the circuit module according to the present invention has a doublesided printed circuit board encased between top and bottom molded sections. The top molded section has junction apertures formed therein, and the bottom molded section has port apertures formed therein. The apertures on the top and bottom molded section are labelled to identify for the electrician the appropriate wiring locations. A clip device is positioned internally of the module adjacent each of the apertures to receive and hold wires inserted within the module through the apertures. The clips also electrically contact a portion of the printed circuit board to conduct current between the wires and the printed circuit board.

The printed circuit board has electrical paths for selectively interconnecting port contacts with junction contacts, whereby each junction is internally connected to at least one of the ports.

A circuit module according to the present invention enables an electrician to wire most standard electrical fixtures by simply inserting the fixture wires into the appropriate junction apertures. The circuit module may then be connected to another circuit module, having a different fixture attached, by simply inserting connecting wires into the appropriate port apertures of both circuit modules. Since each circuit module is identical, installation is effectively standardized.

BRIEF DESCRIPTION OF THE DRAWING

These and other advantages of the invention will become more apparent from the following detailed description of preferred embodiments of the invention, when considered with the accompanying drawings wherein:

FIG. 8 is a schematic of a first wiring embodiment exemplifying the versatility achieved by interconnection of the circuit modules according to the present invention;

FIG. 11 is a schematic of a fourth wiring embodiment interconnecting the circuit modules according to the present invention.

DESCRIPTION OF THE PREFERRED EMBODIMENT

Figure 1A:
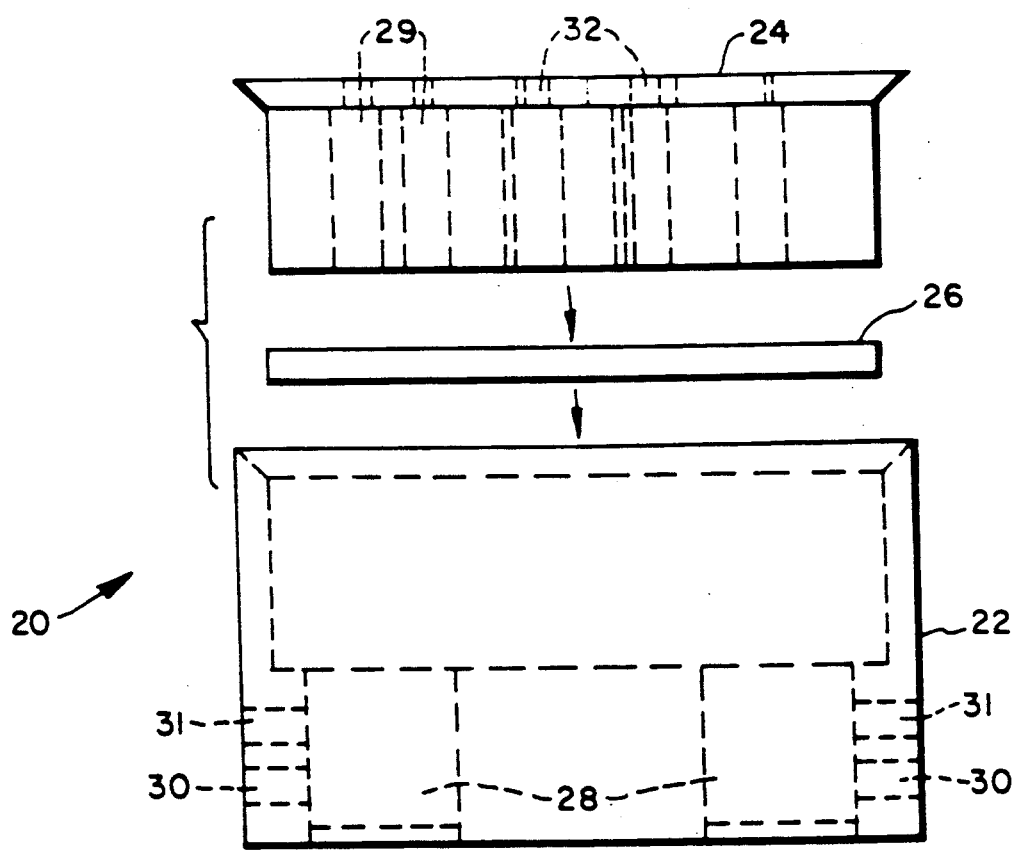
FIG. 1(a) is an exploded side elevational view of a circuit module according to the present invention.
Figure 1B:
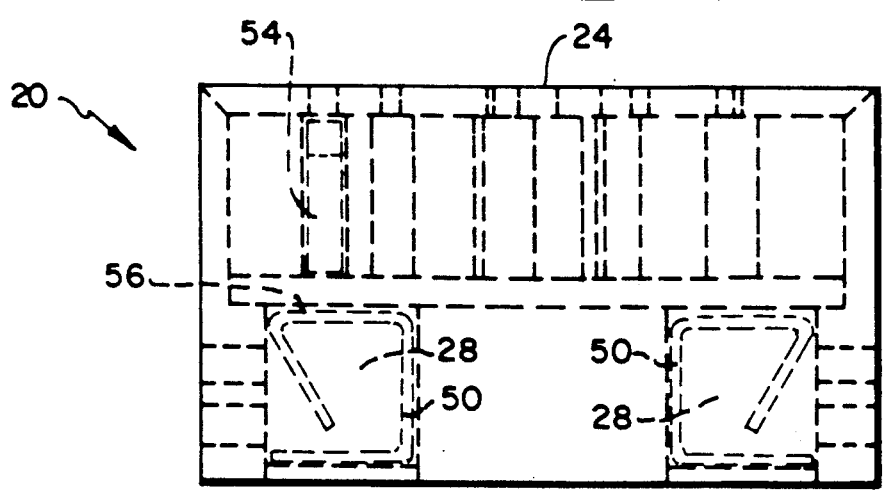
FIG. 1(b) is an assembled side elevational view of the circuit module shown in FIG. 1(a)

Referring to FIGS. 1(a) and 1(b), a prewired circuit module 20 comprises a bottom section 22, a top section 24, and a double-sided printed circuit board (PCB) 26. The bottom section 22 and the top section 24 are molded from plastic and designed to interlock in a conventional manner to form a housing which encases and protects the PCB 26.

The bottom section 22 has multiple clip pockets 28, corresponding port apertures 30 and release apertures 31 formed therein. The clip pockets 28 are deep, rectangular slots which open to the underside of the PCB 26. The port apertures 30 and the release apertures 31 are formed in a stacked relation in the sides of the bottom section 22, and they provide access to the corresponding clip pockets 28. The clip pockets 28 and the port apertures 30 will be discussed in detail hereinafter with reference to FIGS. 2(a) and 2(b). The release apertures will be discussed in more detail with reference to FIG. 6.

The top section 24 has an array of apertures and clip pockets 29 formed therein. As shown in FIG. 1(b), the apertures and the clip pockets provide openings through the top section 24 to the upper surface of the PCB 26. The apertures will be identified and described in detail with reference to FIG. 3(b).

Figure 2B:
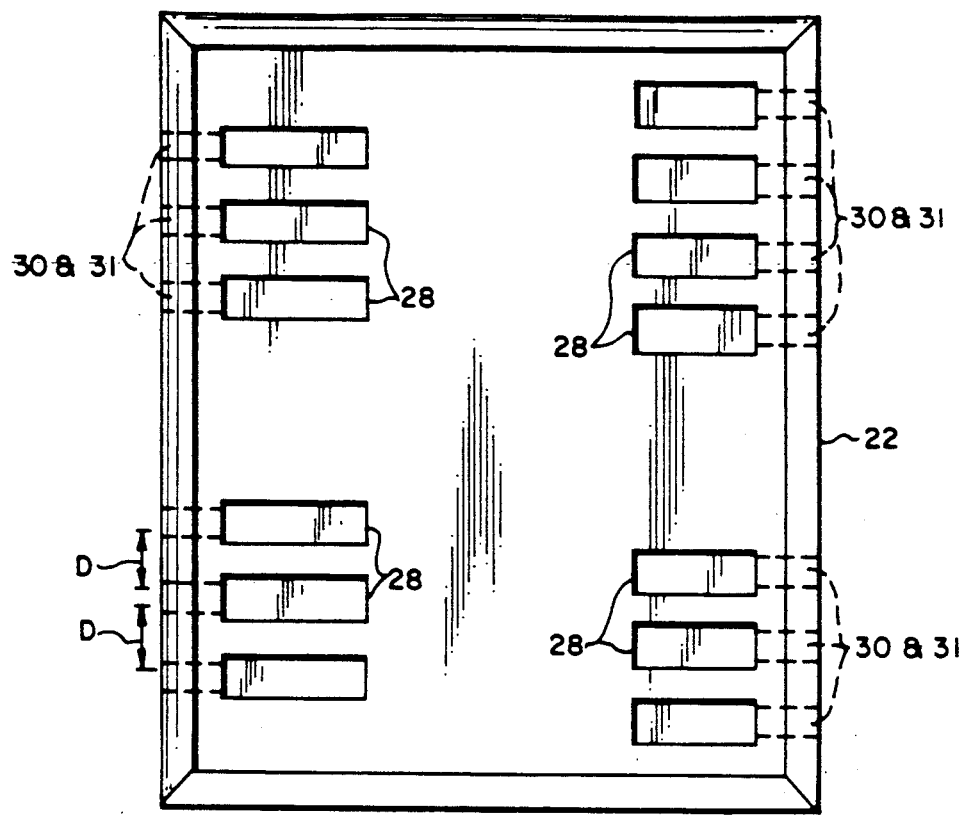
FIG. 2(b) is a top plan view of the bottom section shown in FIG. 2(a)

FIG. 2(b) shows the bottom section 22 as having two sets of three clip pockets 28 along one side and two sets of four and three clip pockets 28, respectively, along the opposite side. A stacked pair of port apertures 30 and release apertures 31 are provided for each clip pocket 28 (see FIG. 2(a)). The port apertures 30 typically are labelled to identify for the electrician the appropriate wiring location. Within each set of clip pockets 28, the corresponding port apertures 30 and the release apertures 31 are spaced apart a distance D, which will be explained in detail with reference to FIG. 6.

Figure 3B:
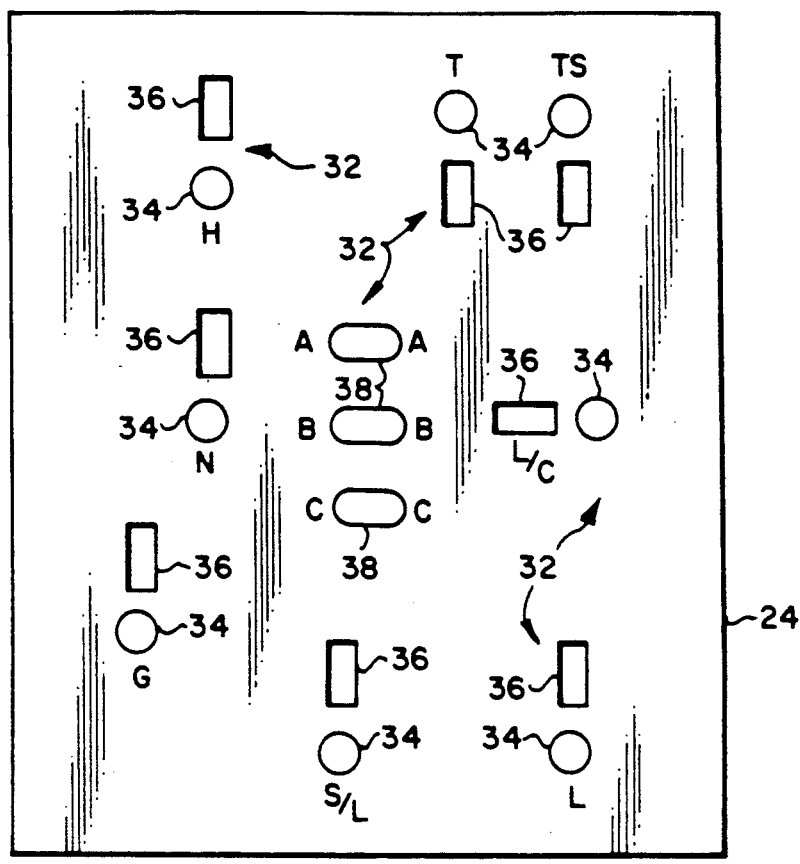
FIG. 3(b) is a top plan view of the top section shown in FIG. 3(a)
Figure 3A:
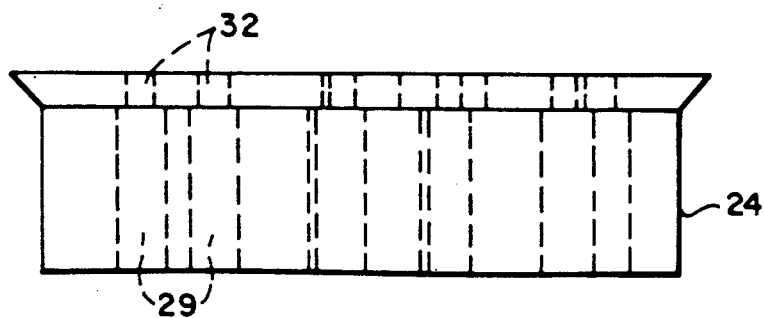
FIG. 3(a) is a side elevational view of the top section shown in FIG. 1(a)

FIG. 3(b) illustrates the top section 24 and the relative location of the junctions apertures formed therein. The apertures, generally identified as 32, comprise eight circular apertures 34, eight corresponding rectangular apertures 36, and three elongated apertures 38.

The circular apertures 34 and rectangular apertures 36 are arranged in eight pairs labelled as follows: H represents the hot side of AC power; N represents the neutral side of AC power; G represents ground; T represents a traveler wire of a conventional three-way switch; TS represents a second traveler wire of a conventional three-way switch; L/C represents the load and common wires of a conventional three-way switch; L represents a load connection; and S/L represents a switched load connection. The rectangular apertures 36 are formed with an appropriate width to receive a small screwdriver for a purpose which will be described in more detail hereinbelow.

The three elongated apertures 38 are labelled as A—A, B—B and C—C. Each elongated aperture 38 has a width dimensioned to receive a shorting bar, which will be described in more detail with reference to FIGS. 4(a)-4(c).

Figure 4A:
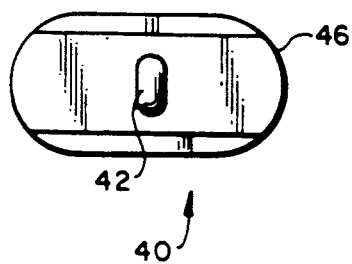
FIG. 4(a) is a bottom plan view of a shorting bar according to the present invention.
Figure 4B:
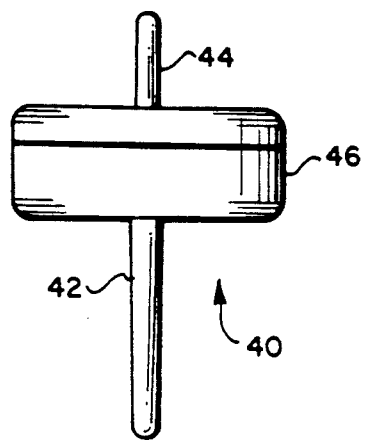
FIG. 4(b) is a side elevational view of a shorting bar shown in FIG. 4(a)
Figure 4C:
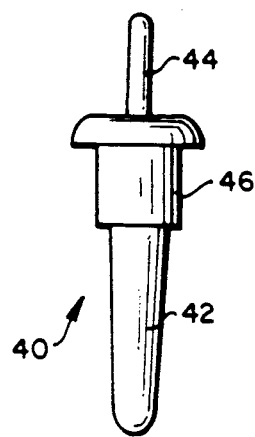
FIG. 4(c) is an end elevational view of a shorting bar shown in FIG. 4(a)

FIGS. 4(a)-4(c) illustrate a shorting bar 40 which comprises a bottom peg 42, a top peg 44 and a body 46. The shorting bar 40 is dimensioned to permit insertions into the elongated apertures 38 in the top section 24. When fully inserted into one of the elongated apertures 38 (i.e., A—A, B—B, C—C), the electrically conductive body 46 of the shorting bar 40 shorts separate paths provided on the PCB 26.

The electrical configuration of the circuit module 20 can be varied by selectively inserting the shorting bar 40 in one of the three elongated apertures 38. The different electrical configurations will be discussed in more detail with reference to FIGS. 7-11.

Figure 5:
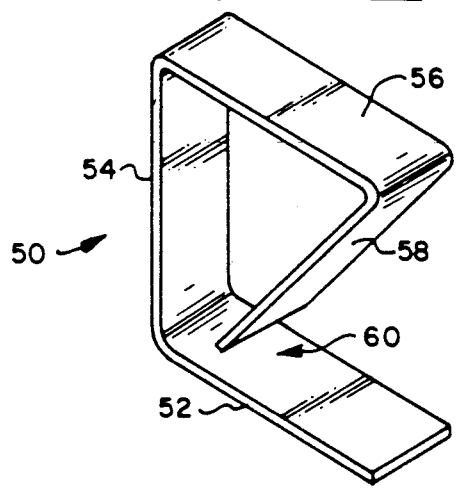
FIG. 5 is a perspective view of a clip employed to secure wires inserted into the circuit module shown in FIG. 1(a)

FIG. 5 depicts a clip 50 which has a first arm 52, a second arm 54, a third arm 56 arranged in a substantially C-shaped configuration. The free end of arm 56 is folded to form a fourth arm 58 angled inwardly toward arm 52 to form an insertion space 60 between arm 52 and the end of arm 58. Clip 50 is formed from a resilient conducting material, such as copper. Consequently, when a wire, such as three or four conductor type Romex wire, is inserted within insertion space 60, it is releasably held in place within the clip 50.

A clip 50 is positioned in each of the clip pockets 28 in the bottom section 22, and within each of the clip pockets 29 underlying the respective pairs of junction apertures 34 and rectangular apertures 36 in the top section 24. A clip 50 positioned within a clip pocket 28 is oriented such that its insertion space 60 faces the corresponding port aperture 30 (for example, if the clip 50 is positioned in the clip pocket 28 on the left in FIG. 2(a), the insertion space 60 would be facing to the left toward the port aperture 30). In this position, a wire inserted into the port aperture 30 will be guided directly into the insertion space 60. The arm 56 of the clip 50 abuts a conductive area on the underside of the PCB 26, thereby completing an electrical connection between the inserted wire and the PCB 26.

A clip 50 positioned within a clip pocket 29 in the top section 24 is oriented such that its insertion space 60 is facing the corresponding junction aperture 34. In this manner, a wire inserted into a junction aperture 34 will be guided directly into the insertion space 60. The arm 54 within clip pocket 29 abuts a conductive area on the upper surface of the PCB 26, thereby providing an electrical connection between the inserted wire and the PCB 26.

Figure 6:
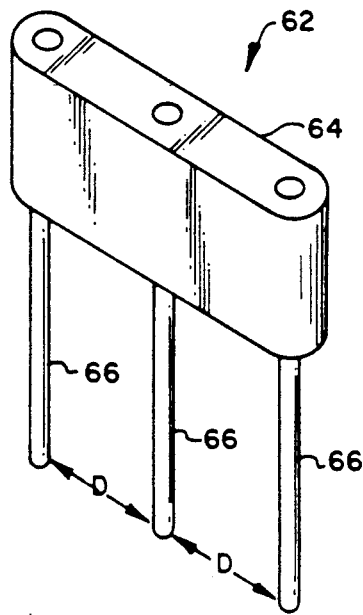
FIG. 6 is a perspective view of a device for releasing wires secured in clips of the type shown in FIG. 5.

FIG. 6 illustrates a non-conductive wire release device 62 comprising a base portion 64 and three pegs 66. The pegs 66 are spaced apart a distance D corresponding to the distance D between a set of three release apertures 31 in the bottom section 22 as shown, for example, in FIG. 2(b). The release device 62 is not an integral part of the circuit module 20. Instead, it is a separate workpiece employed by an electrician to disconnect wires from the port apertures 30 of the bottom section 22.

Figure 2A:
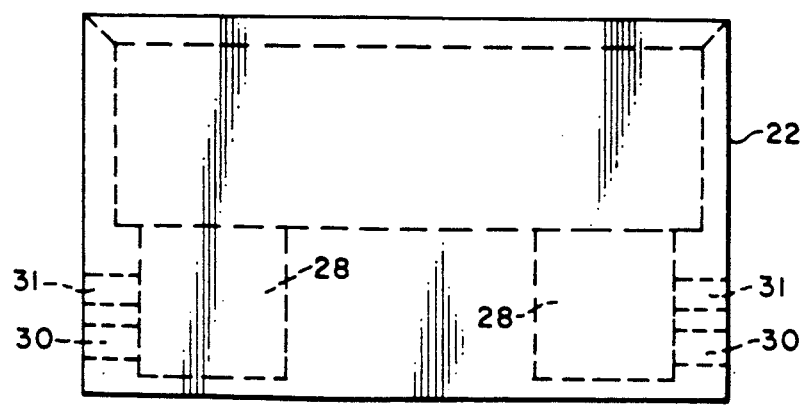
FIG. 2(a) is a side elevational view of the molded bottom section of the circuit module shown in FIG. 1(a)

To release wires inserted into a set of three port apertures 30, the electrician grasps the base portion 64 of device 62, and inserts the three pegs 66 into the release apertures 31 (see FIGS. 2(a) and 2(b)). Each peg 66 engages the arm 58 of the respective clip 50 causing it to flex inwardly toward the arm 54, thereby increasing the insertion space 60. The wire may then be removed from the clip 50 and the port aperture 30.

The release device 62 shown in FIG. 6 is designed to simultaneously release three wires from a set of port apertures 30. However, it should be noted that a release device having a different number of pegs for simultaneously releasing more or fewer wires is contemplated by this invention.

The release device 62 is not employed to disconnect wires from the clips 50 positioned in the top section 24. To release wires from the junction apertures 34 in the top section 24, a small screwdriver is inserted into the corresponding rectangular aperture 36 to flex the arm 58 of the clip 50, whereby the insertion space 60 is increased permitting the wire to be freed.

Figure 7:
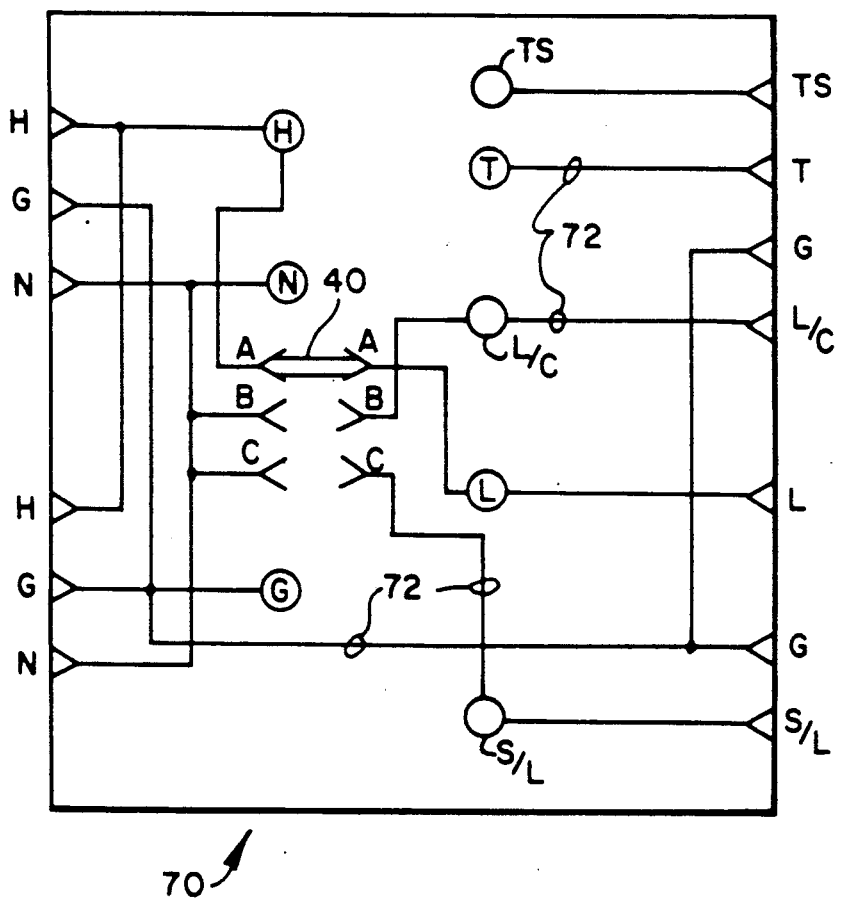
FIG. 7 is a schematic diagram of the wiring of a circuit module according to the present invention.

FIG. 7 illustrates a typical circuit representation of the PCB 26 of the circuit module 20 according to the present invention. The circuit 70 has along its peripheral edges a set of electric ports (designated by triangles), including four G ports, two N ports, two H ports, a TS port, a T port, an L/C port, an L port and an S/L port. The ports are arranged on the circuit 70 to be exposed to the interiors of the clip pockets 28 shown in FIG. 2(b).

The circuit 70 also concludes one junction (designated as a circle "o" around the respective letter) for each of the eight conducting line types H, G, N, TS, T, L/C, L and S/L. The junctions are arranged on the circuit 70 to be expressed to the interiors of the clip pockets 29 in the top section 24 underlying the junction apertures 34 shown in FIG. 3(b).

Each junction is electrically connected via a conducting path 72 to the correspondingly labelled port or ports. For example, the G junction is electrically connected to all four G ports.

The circuit 70 further comprises shorting terminals A—A, B—B and C—C which provide electrical breaks between certain conducting paths. The shorting terminals A—A, B—B and C—C are arranged on the circuit 70 to underlie the similarly labelled elongated apertures 38 in the top section 24 shown in FIG. 3(b).

The shorting terminals A—A are coupled to the H and the L junctions; the shorting terminals B—B are coupled between the conducting path 72 between the N type ports and junction and the L/C junction; and the shorting terminals C—C are coupled between the N type conducting path and the S/L junction. Each pair of shorting terminals A—A, B—B and C—C are spaced to receive the shorting bar 40 (see FIGS. 4(a)–4(c)), shown here as being inserted between shorting terminals A—A. As discussed previously, however, the shorting bar 40 may be inserted between one of any pair of the three shorting terminals A—A, B—B and C—C pairs to alter the circuit 70 (as is readily apparent from FIG. 7), thereby providing various electrical adaptations.

To demonstrate the versatility of the present invention, FIGS. 8–11 illustrate four different wiring embodiments.

FIG. 8 depicts a first embodiment wherein a first circuit module 80 (represented in schematic form) is adapted to communicate with a typical single pole switch 74, while a second circuit module 82 is adapted to communicate with a typical load, such as a lamp 76. To facilitate the description, a circuit module coupled to a switch hereinafter will be referred to as a "switch" module, and a circuit module coupled to a load will be called a "load" module.

In the first embodiment, the AC power is input to switch module 80 at one set of H, G and N ports. In accordance with conventional wiring codes, black insulated wire representing the hot side of AC power is input to the H port, white insulated wire representing the neutral side of AC power is input to the N port, and bare copper (or other colored wire) representing ground is input to the G input.

The single pole switch 74 is coupled to the H and L junctions of switch module 80. Shorting bar 81 is positioned between shorting terminals C—C.

Switch module 80 is coupled to the load module 82 via a two conductor, plus ground, Romex wire 78. The L, G and S/L ports of switch module 80 are connected to the H, G and N ports of the load module 82, respectively.

The lamp 76 is connected to the H and N junctions of load module 82. A shorting bar 83 is not required in the load module 82 for the present circuit, so it is stored between shorting terminals C—C.

According to the wiring configuration shown in FIG. 8, AC voltage is applied to the switch 74 via an H port and the H junction of the switch module 80. If the switch 74 is OFF, the circuit is open, and no current flows. On the other hand, if the switch 74 is ON, a current path exists through the switch 74, the L junction and the L port of the switch module 80. The wire 78 carries current to an H port of the load module 82. Within module 82, the current path is from the H port, through the H junction and the lamp 76, through the N junction to the N port of load module 82. The current path continues from module 82 via the wire 78 to an N port of the switch module 80. From there, the current is routed internally via shorting bar 81 to another N port of the switch module 80. Accordingly, the switch 74 controls the power to the lamp 76.

As demonstrated in the embodiment just described, the circuit module according to the present invention is adaptable to both a single pole switch and a lamp.

The connection of the switch 74 and the lamp 76 is simply and quickly accomplished because an electrician simply inserts the wires from the switch 74 and the lamp 76 into the appropriate locations on the circuit modules. For example, the electrician inserts (1) the wires leading to the switch 74 into the H and L junctions of the switch module 80 (i.e., into the corresponding junction apertures 34 in the top section 24 of the switch module 80) and (2) the wires leading to lamp 76 into the H and N junctions of the load module 82 (i.e., into the corresponding junction apertures 34 in the top section 24 of the load module 82). The electrician then connects the two circuit modules 80 and 82 by inserting the connecting wire into the appropriate ports of each module (i.e., into the corresponding port apertures 30 of the bottom section 22 of each module).

Figure 9:
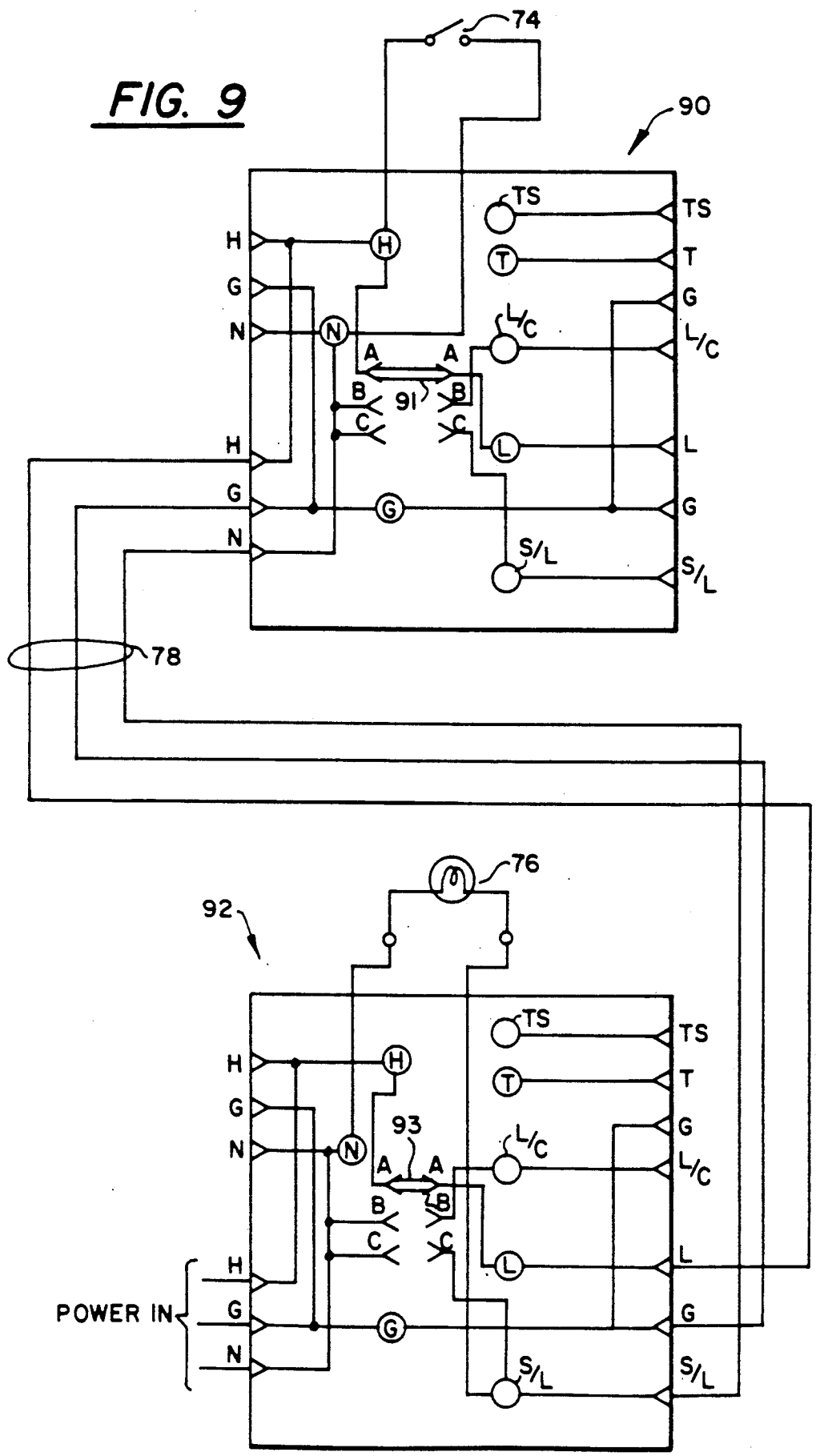
FIG. 9 is a schematic of a second wiring embodiment interconnecting the circuit modules according to the present invention.

FIG. 9 illustrates a second embodiment of the present invention which is similar to the first embodiment shown in FIG. 8 in that a switch module 90 is adapted to communicate with a switch 74 and a load module 92 is adapted to communicate with a lamp 76. However, unlike the first embodiment, AC power is input to the load module 92, rather than input to the switch module 90. As a result, both modules 90 and 92 must be wired differently, using junctions and ports different than those employed by modules 80 and 82 in FIG. 8.

The switch 74 is coupled to the H and N junctions of the switch module 90. A shorting bar 91 is not required in the switch module 90, so it is stored between the shorting terminals A—A. One set of H, G and N ports of the switch module 90 is connected via two conductor, plus ground, Romex wire 78 to the L, G and S/L ports, respectively, of the load module 92.

The lamp 76 is coupled to the N and S/L junctions of the load module 92. A shorting bar 93 is employed between the shorting terminals A—A to connect electrically the H and L junctions.

According to the wiring configuration shown in FIG. 9, AC current flows (providing that switch 34 is ON) in the following path: through the H port, the H junction, the shorting bar 93, the L junction, and the L port of load module 92; along the wire 78; through the H port, the H junction, the switch 74, the N junction, and the N port of the switch module 90; back along the wire 78; and through the S/L port, the S/L junction, the lamp 76, the N junction, and the N port of the load module 92. Accordingly, the switch 74 controls power to the lamp 76.

Figure 10:
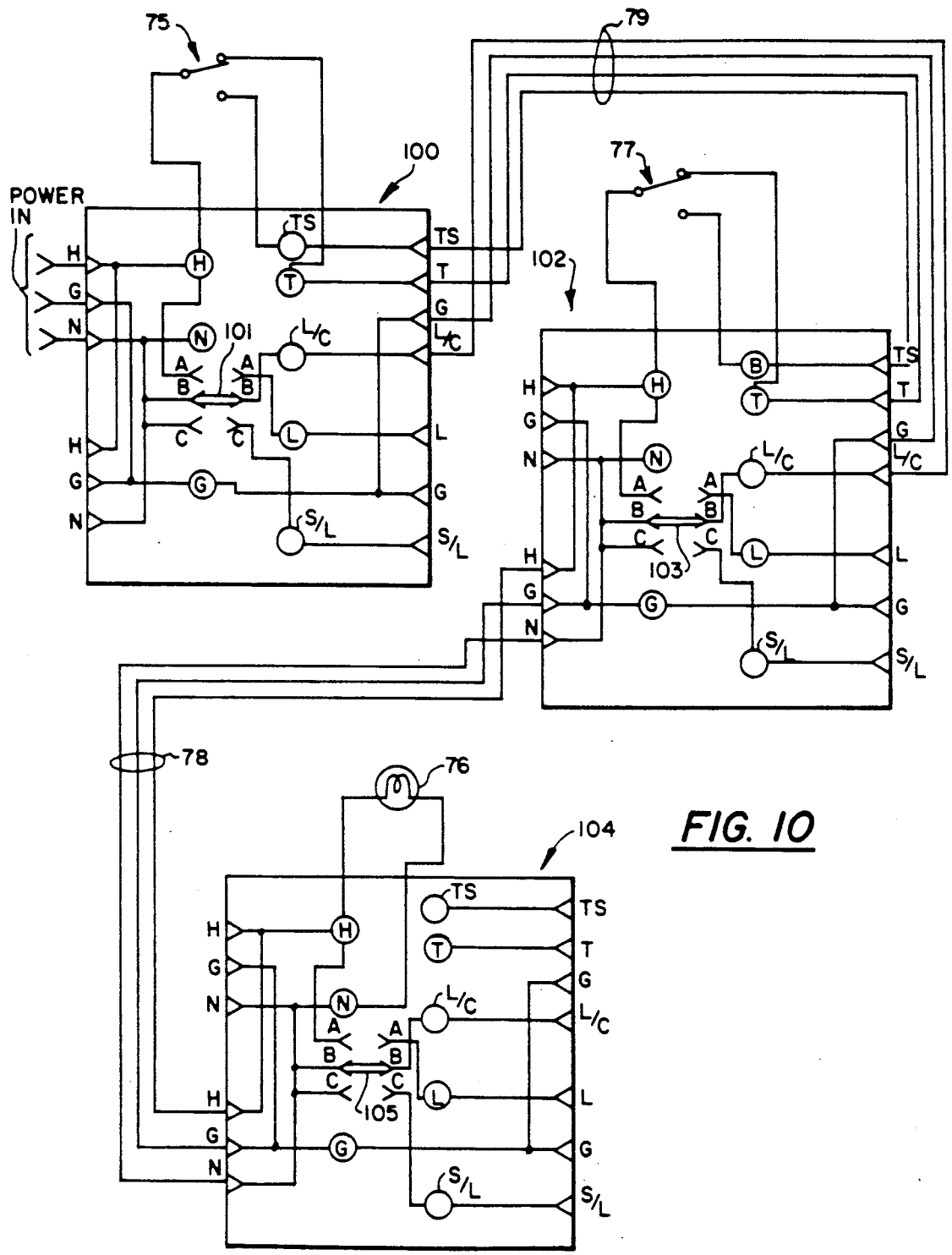
FIG. 10 is a schematic of a third wiring embodiment interconnecting the circuit modules according to the present invention.

FIG. 10 shows a third embodiment of the present invention wherein two switch modules 100 and 102 are adapted to communicate with conventional three-way switches 75 and 77, respectively, and a load module 104 is adapted to communicate with a lamp 76. AC power is applied to the switch module 100, but alternatively, it may be input to the switch module 102.

The switch modules 100 and 102 are identically connected with respect to their associated three-way switches 75 and 77 and placement of respective shorting bars 101 and 103. The three-way switch 75 is coupled to the H, TS and T junctions of the switch module 100. Likewise, the three-way switch 77 is coupled to the H, TS and T junctions of the switch module 102. The shorting bars 101 and 103 of the switch modules 100 and 102 are inserted between the shorting terminals B—B, thereby connecting the N type conducting path with the L/C junction.

The switch module 100 is wired to the switch module 102 via three conductor, plus ground, Romex wire 79. The TS, T, G and L/C ports of switch module 100 are connected to the TS, T, G and L/C ports of switch module 102, respectively. The switch module 102 is wired to the load module 104 via two conductor, plus ground, Romex wire 78 between respective H, G and N ports.

The lamp 76 is coupled to the H and N junctions of the load module 104. The shorting bar 105 is not employed in the load module 104, but instead is stored between the shorting terminals B—B.

According to this third embodiment, an AC current path extends from an H port of the switch module 100 to the common wiper of the three-way switch 75 via an H junction. Depending upon the position of the three-way switch 75, the current path is through either the TS junction or the T junction of the switch module 100 to the respective TS or T port, and along wire 79 to the TS or T port of the switch module 102. To permit the flow of current, the three-way switch 77 must be positioned identically to the three-way switch 75. When this condition is met, the AC current path continues through junction T or TS and three-way switch 77, through junction H and out an H port of the switch module 102, along wire 78 to an H port of the load module 104. From junction H of load module 104, the AC current path is through the lamp 76 from which it returns to module 104 via an N junction. The current path continues through port N of module 104 and wire 78.

The shorting bar 103 permits the current path to continue from the N port of module 102 to the L/C port of the module 102 via junction L/C. The AC current path continues along wire 79 to the L/C port of the switch module 100, and then through junction L/C and the shorting bar 101 to an N port.

In this wiring embodiment, an electrician connects two three-way switches to the H, TS and T junctions of two modules and a lamp to the H and N junctions of a third module. The three circuit modules are then coupled together by wiring the appropriate ports of each module, as just described.

FIG. 11 illustrates a fourth embodiment of the present invention which is similar to the third embodiment of FIG. 10 in that two switch modules 110 and 112 are adapted to communicate with two three-way switches 75 and 77, respectively, while a load module 114 is adapted to communicate with a lamp 76. However, unlike the third embodiment, AC power is input at the load module 114, thereby altering the wiring scheme.

In this embodiment, the three-way switch 75 is coupled to the L/C, TS and T junctions of the switch module 110. The shorting bar 111 is not employed in switch module 110, so it is stored between the shorting terminals B—B. The three-way switch 77 is coupled to the H, TS and T junctions of the switch module 112, and the shorting bar 113 is inserted between the shorting terminals B—B to connect the N and L/C junctions.

The lamp 76 is coupled to the N and S/L junctions of the load module 114. The shorting bar 115 is inserted between the shorting terminals A—A to electrically couple the H and L junctions. AC power is input to one set of the H, G and N ports of the load module 114.

According to this fourth embodiment, the AC current path extends from an H port of load module 114, through the shorting bar 115 and junction L to the L port. The path continues along the wire 78 and through an H port and H junction of the switch module 112 to the common wiper of the three-way switch 77. Depending upon the position of the three-way switch 77, the current path proceeds through either the TS junction or the T junction and through the respective TS or T port of module 112 to the TS or T port of the switch module 110 via wire 79. To permit current flow, the three-way switch 75 of module 110 must be positioned identically to the three-way switch 77 of the switch module 112. When this condition is met, the current path continues through the TS or T junction of module 110, through switch 75, and through the L/C junction and port of module 110. The path proceeds along wire 79 to the L/C port and junction of module 112, through the shorting bar 113 and the N port of the switch module 112 to the S/L port of the load module 114 via wire 78. The AC current path then passes through the S/L junction and lamp 76 to an N port of module 114.

As demonstrated by the four wiring embodiments, the present invention is adaptable to numerous electrical fixtures and wiring environments. The circuit module provides easy installation as an electrician merely inserts the appropriate wires into the appropriate circuit module locations. Accordingly, wiring time and the possibility of miswiring are reduced, thereby reducing electrician costs.

It is to be understood that the invention is not limited to the disclosed embodiment, but is intended to cover various modifications and equivalent arrangements included within the spirit and scope of the appended claims.

We claim:

1. A circuit module comprising:
    (1) housing including:
        a bottom and a top section, each said section having a corresponding plurality of apertures, clip pockets and release apertures formed therein, said apertures and corresponding release apertures being positioned in adjacent relationship and providing access to corresponding said clip pockets, said top section further including a plurality of second apertures;
    (2) a plurality of electrically conductive clips, each adapted for releasably retaining a wire, one of said clips being positioned in each said clip pocket; and
    (3) a printed circuit board, disposed between said bottom and top sections of said housing and electrically contacting each of said plurality of clips, having a plurality of conducting paths formed thereon for providing a plurality of electrical configurations; and
    (4) a shorting bar, adapted to be selectively inserted into one of said second apertures provided in said top section, for connecting two of said plurality of conducting paths on said printed circuit board, whereby when said shorting bar is inserted into another one of said second apertures, said shorting bar connects a different two of said plurality of conducting paths, thereby changing the electrical configuration of said circuit module.

2. A circuit module according to claim 1, wherein said apertures formed in said top and bottom sections are labelled.

3. A circuit module according to claim 1, further comprising means for releasing said wires from said clips, said releasing means comprising:
    a base; and a plurality of pegs extending from said base in spaced, parallel relationship, each peg having a cross-sectional diameter less than a diameter of said release apertures, said pegs being adapted to be inserted into said release apertures to contact and flex said corresponding clips to release said wires from the flexed clips.

4. A circuit module according to claim 1, wherein said printed circuit board is a double-sided printed circuit board.

5. A circuit module according to claim 1, wherein said housing is formed of molded plastic.

6. A circuit module comprising:
(1) housing including:
  a bottom and a top section, each said section having a corresponding plurality of apertures, clip pockets and release apertures formed therein, said apertures and corresponding release apertures being positioned in adjacent relationship and providing access to corresponding said clip pockets, said top section further including a plurality of second apertures;
(2) a plurality of electrically conductive clips, each adapted for releasably retaining a wire, one of said clips being positioned in each said clip pocket; and
(3) a double-sided printed circuit board, disposed between said bottom and top sections of said housing and electrically contacting at predetermined locations of said circuit board each of said plurality of clips, said circuit board having a plurality of conducting paths formed thereon for interconnecting said locations in a plurality of predetermined electrical configurations; and
(4) a shorting bar, adapted to be selectively inserted into one of said plurality of second apertures provided in said top section, for connecting at least two of said conducting paths on said circuit board to select one of said predetermined electrical configurations, whereby when said shorting bar is inserted into another one of said second apertures, said shorting bar connects a different two of said plurality of conducting paths to change said circuit module to another of said predetermined electrical configurations.

7. A circuit module comprising:
(1) housing including:
  a bottom section having a corresponding plurality of apertures, clip pockets and release apertures formed therein, said apertures and corresponding release apertures being positioned in adjacent relationship and providing access to corresponding said clip pockets;
  a top section having a corresponding plurality of first apertures, clip pockets and release apertures formed therein, said first apertures and corresponding release apertures being positioned in adjacent relationship and providing access to corresponding said clip pockets, said top section further including a plurality of second apertures;
(2) a plurality of electrically conductive clips, each adapted for releasably retaining a wire, one of said clips being positioned in each said clip pocket formed in said top and bottom sections; and
(3) a double-sided printed circuit board, disposed between said bottom and top sections of said housing, said circuit board comprising:
  at least two sets of electrical ports, each of said sets having at least three contacts which electrically contact corresponding ones of said clips positioned in said bottom section of said housing;
  at least two electrical junction contacts, each electrically contacting corresponding ones of said clips positioned in said top section of said housing; and
  a plurality of conducting paths for interconnecting ones of said port contacts to ones of said junction contacts in a plurality of predetermined electrical configurations; and
(4) a shorting bar, adapted to be selectively inserted into one of said plurality of second apertures provided in said top section of said housing, for connecting at least two of said conducting paths on said circuit board to select one of said predetermined electrical configurations, whereby when said shorting bar is inserted into another one of said second apertures, said shorting bar connects a different two of said plurality of conducting paths to change said circuit module to another of said predetermined electrical configurations.

8. A circuit module comprising:
(1) housing including:
  a bottom section having a corresponding plurality of apertures, clip pockets and release apertures formed therein, said apertures and corresponding release apertures being positioned in adjacent relationship and providing access to corresponding said clip pockets;
  a top section having a corresponding plurality of first apertures, clip pockets and release apertures formed therein, said first apertures and corresponding release apertures being positioned in adjacent relationship and providing access to corresponding said clip pockets, said top section further including at least two second apertures;
(2) a plurality of electrically conductive clips, each adapted for releasably retaining a wire, one of said clips being positioned in each said clip pocket formed in said top and bottom sections; and
(3) a double-sided printed circuit board, disposed between said bottom and top sections of said housing, said circuit board comprising:
  first, second and third sets of electrical ports, each said set having three contacts for electrically contacting corresponding ones of said clips positioned in said bottom section of said housing;
  a fourth set of electrical ports having four contacts for electrically contacting corresponding ones of said clips positioned in said bottom section of said housing;
  eight electrical junction contacts, each electrically contacting corresponding ones of said clips positioned in said top section of said housing;
  a plurality of conducting paths for interconnecting ones of said port contacts to ones of said junction contacts such that each of said port contacts is connected to at least one of said junction contacts, said conducting paths also forming at least two pairs of shorting terminals positioned correspondingly to said second apertures in said top section of said housing; and
(4) a shorting bar, adapted to be selectively inserted into one of said plurality of second apertures provided in said top section of said housing, to electrically connect the terminals of the selected pair of shorting terminals.

* * * * *